US012777888B2

(12) United States Patent
Kajino et al.

(10) Patent No.: US 12,777,888 B2
(45) Date of Patent: Oct. 27, 2026

(54) CENTERING DEVICE AND SUBSTRATE PROCESSING APPARATUS

(71) Applicant: SCREEN HOLDINGS CO., LTD., Kyoto (JP)

(72) Inventors: Itsuki Kajino, Kyoto (JP); Shoyo Minami, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 257 days.

(21) Appl. No.: 18/340,362

(22) Filed: Jun. 23, 2023

(65) Prior Publication Data

US 2024/0038565 A1 Feb. 1, 2024

(30) Foreign Application Priority Data

Jul. 27, 2022 (JP) ................................ 2022-119717

(51) Int. Cl.
*H10P 72/50* (2026.01)
*H10P 72/00* (2026.01)
(Continued)

(52) U.S. Cl.
CPC .......... *H10P 72/50* (2026.01); *H10P 72/0414* (2026.01); *H10P 72/0422* (2026.01);
(Continued)

(58) Field of Classification Search
CPC ............... H01L 21/68; H01L 21/67051; H01L 21/6838; H01L 21/68728; H01L 21/67075; H01L 21/6708
See application file for complete search history.

(56) References Cited

U.S. PATENT DOCUMENTS

2006/0102289 A1 5/2006 Fukatsu et al.
2013/0206726 A1* 8/2013 Oono ................. H10P 72/0424 216/85

(Continued)

FOREIGN PATENT DOCUMENTS

CN 112201607 A * 1/2021 ............. H10P 72/32
JP 2003-243294 A 8/2003

(Continued)

OTHER PUBLICATIONS

JP4222997 translation (also named JP2006140385) (Year: 2009).*

(Continued)

*Primary Examiner* — Michael E Barr
*Assistant Examiner* — Lauren G Orta
(74) *Attorney, Agent, or Firm* — Rimon P.C.

(57) ABSTRACT

A centering device has three or more contact members each having a contact surface capable of contacting an end face of a substrate supported by a substrate support. These contact members are arranged to surround the substrate support in a horizontal plane with the contact surfaces facing an end face of the substrate. These contact members move toward the substrate in the mutually different directions to sandwich the substrate. Each contact surface is finished such that a contactable region formed to intersect the horizontal plane has a linear shape or a curved shape having a center of curvature located on the substrate side and having the radius of curvature larger than the radius of the substrate and is longer than an arc formed by cutting out the circumference of the substrate by the cut.

2 Claims, 8 Drawing Sheets

(51) Int. Cl.
*H10P 72/76* (2026.01)
*H10P 72/78* (2026.01)

(52) U.S. Cl.
CPC ...... *H10P 72/0424* (2026.01); *H10P 72/7608* (2026.01); *H10P 72/78* (2026.01)

(56) References Cited

U.S. PATENT DOCUMENTS

| | | | | |
|---|---|---|---|---|
| 2015/0303091 | A1 * | 10/2015 | Ruda Y Witt | .... H01L 21/68785 414/784 |
| 2016/0322248 | A1 | 11/2016 | Fukushima et al. | |
| 2020/0365422 | A1 * | 11/2020 | Amano | ............... H10P 72/0424 |

FOREIGN PATENT DOCUMENTS

| | | | | | |
|---|---|---|---|---|---|
| JP | 2006-060161 | A | | 3/2006 | |
| JP | 2006-140385 | A | | 6/2006 | |
| JP | 2006-210373 | A | | 8/2006 | |
| JP | 2006-222190 | A | | 8/2006 | |
| JP | 2007-227823 | A | | 9/2007 | |
| JP | 4222997 | B2 | * | 2/2009 | |
| JP | 2009-147148 | A | | 7/2009 | |
| JP | 4312145 | B2 | | 8/2009 | |
| JP | 2010-074108 | A | | 4/2010 | |
| JP | 2019-125756 | A | | 7/2019 | |
| JP | 2019-149423 | A | | 9/2019 | |
| JP | 2022052835 | A | * | 4/2022 | ....... H01L 21/67109 |
| KR | 100751496 | B1 | | 8/2007 | |
| KR | 10-2016-0086381 | A | | 7/2016 | |
| TW | 202215590 | A | | 4/2022 | |

OTHER PUBLICATIONS

JP2022052835 translation (Year: 2022).*

CN112201607 translation (Year: 2021).*

Notice of Allowance issued for the corresponding Korean Patent Application No. 10-2023-0073922 dated Jan. 22, 2025.

Office Action issued for the corresponding Taiwanese Patent Application No. 112121853 dated Jan. 16, 2024.

Office Action issued for the corresponding Korean Patent Application No. 10-2023-0073922 dated Sep. 12, 2024.

Office Action dated Feb. 3, 2026, issued in corresponding Japanese Patent Application No. JP2022-119717.

* cited by examiner

CENTERING DEVICE AND SUBSTRATE PROCESSING APPARATUS

CROSS REFERENCE TO RELATED APPLICATION

The disclosure of Japanese Patent Application No. 2022-119717 filed on Jul. 27, 2022 including specification, drawings and claims is incorporated herein by reference in its entirety.

BACKGROUND OF THE INVENTION

1. Field of the Invention

This invention relates to a centering technique for horizontally moving and positioning a substrate such that a center of the substrate is aligned with a center of a substrate support with the disk-like substrate provided with a cut such as a notch in a peripheral edge part placed in a horizontal posture on the upper surface of the substrate support and a substrate processing apparatus for processing a substrate using the centering technique. This process includes a bevel etching process.

2. Description of the Related Art

In a known substrate processing apparatus, a chemical liquid process or a cleaning process is performed by supplying a processing liquid to a peripheral edge part of a substrate such as a semiconductor wafer while rotating the substrate. In an apparatus described in Japanese Patent Application Laid-Open No. 2019-149423, for example, a substrate is held under suction while being supported from below by a spin chuck (corresponding to an example of a "substrate support" of the present invention). In this case, misalignment between the center of the spin chuck and the center of the substrate decreases processing quality. In response to this, the above-described apparatus performs what is called a centering operation of reducing the amount of decentering of the substrate from the spin chuck before implementation of the process on the substrate.

SUMMARY OF INVENTION

The above-described conventional apparatus performs the centering operation in two stages. First, the amount of decentering i.e. eccentricity of the substrate from the spin chuck is measured. Next, the substrate on the spin chuck is pushed horizontally with a pusher to move the center of the substrate toward the center (rotary axis) of the spin chuck. Hence, room for improvement is left in terms of throughput.

Accordingly, a technique for performing the centering process without measuring the eccentricity amount is being studied. More particularly, three or more contact members are provided to surround the spin chuck in a horizontal plane. The contact members sandwich the substrate by moving toward an end face of the substrate in mutually different directions with the substrate placed on the spin chuck. In this way, the center of the disk-like substrate placed on the upper surface of the spin chuck can be aligned with the center of the spin chuck only by movements of the contact members.

However, if the substrate is provided with the cut such as a notch, centering accuracy is different depending on the configurations of the contact members as described in detail later with reference to FIG. 4. Accordingly, in the centering device using three or more contact members, the configurations of the contact members need to be devised to enhance centering accuracy. However, this point has not been sufficiently studied.

This invention was developed in view of the above problem and aims to enhance centering accuracy in a centering device using three or more contact members provided to surround a substrate support having a disk-like substrate having a cut in a peripheral edge part placed thereon in a horizontal plane and a substrate processing apparatus using the centering device.

A first aspect of the invention is a centering device for horizontally moving and positioning a substrate such that a center of the substrate is aligned with a center of a substrate support with the disk-like substrate provided with a cut in a peripheral edge part placed in a horizontal posture on an upper surface of the substrate support. The device comprises: three or more contact members each having a contact surface capable of contacting an end face of the substrate, the three or more contact members being arranged to surround the substrate support in a horizontal plane in such a posture that the contact surfaces face the end face of the substrate; a moving mechanism configured to move the contact members toward the substrate in mutually different directions; and a controller configured to control the moving mechanism to sandwich the substrate by moving the contact members toward the substrate. Each contact surface is finished such that a contactable region formed to intersect the horizontal plane has a linear shape or a curved shape having a center of curvature on the substrate side and having a radius of curvature larger than a radius of the substrate and is longer than an arc formed by cutting out a circumference of the substrate by the cut.

A second aspect of the invention is a substrate processing apparatus. The apparatus comprises: a substrate support having an upper surface configured to support a disk-like substrate provided with a cut in a peripheral edge part in a horizontal posture; the centering device; a suction unit configured to suck and hold the substrate on the substrate support by exhausting air between the substrate positioned by the centering device and the substrate support; a rotation driver configured to rotate the substrate support sucking and holding the substrate about a center of the substrate support; and a processing liquid supply mechanism configured to supply a processing liquid to the peripheral edge part of the substrate rotated about the center of the substrate support integrally with the substrate support.

In the invention thus configured, three or more contact members each having the contact surface capable of contacting the end face of the substrate are provided. These contact members are arranged to surround the substrate support in the horizontal plane with the contact surfaces facing the end face of the substrate. These contact members move toward the substrate in the mutually different directions to sandwich the substrate. At this time, if the contact surface is facing the cut of the substrate, there is an influence of the cut. However, in the invention, the contact surface is finished such that the contactable region formed to intersect the horizontal plane has the linear shape or the curved shape having the center of curvature located on the substrate side and having the radius of curvature larger than the radius of the substrate and is longer than the arc formed by cutting out the circumference of the substrate by the cut. This can prevent a part of the contact member from entering the cut, with the result that the influence of the cut on centering accuracy is suppressed.

According to the invention, centering accuracy can be enhanced.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

DETAILED DESCRIPTION OF THE PREFERRED EMBODIMENTS

Figure 1:
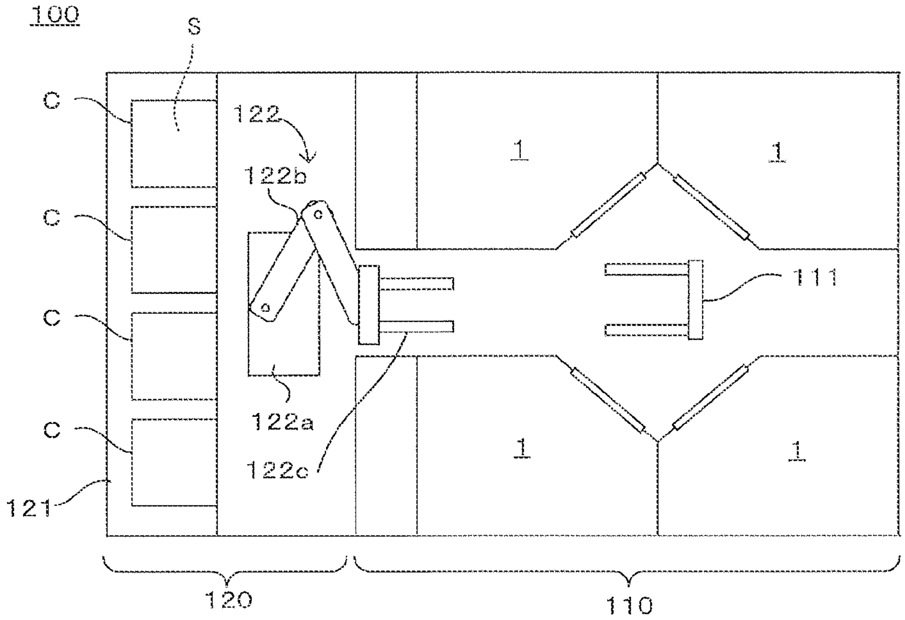
FIG. 1 is a drawing showing a substrate processing system equipped with an embodiment of a substrate processing apparatus according to the invention.

FIG. 1 is a drawing showing a substrate processing system equipped with an embodiment of a substrate processing apparatus according to the invention. The substrate processing apparatus 100 includes a substrate processing station 110 for processing the substrate S and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate S from the container C by accessing the container C held by the container holder 121 and housing a processed substrate S in the container C. A plurality of the substrates W are housed substantially in a horizontal posture in each container C.

The indexer robot 122 includes a base 122*a* fixed to an apparatus housing, an articulated arm 122*b* provided rotatably about a vertical axis with respect to the base 122*a*, and a hand 122*c* mounted on the tip of the articulated arm 122*b*. The hand 122*c* is structured such that the substrate S can be placed and held on the upper surface thereof. Such an indexer robot including the articulated arm and the hand for holding the substrate is not described in detail since being known.

The substrate processing station 110 includes a substrate conveyor robot 111 arranged substantially in a center in a plan view and a plurality of processing units 1 arranged to surround this substrate conveyor robot 11. Specifically, the plurality of (eight in this example) processing units 1 are arranged to face a space where the substrate conveyor robot 111 is arranged. The substrate conveyor robot 111 randomly accesses these processing units 1 and transfers the substrates W. On the other hand, each processing unit 1 performs a predetermined processing to the substrate S. In this embodiment, these processing units 1 have the same function. Thus, a plurality of the substrates W can be processed in parallel. In the embodiment, one of the processing units 1 corresponds to the substrate processing apparatus 10 according to the invention.

Figure 2:
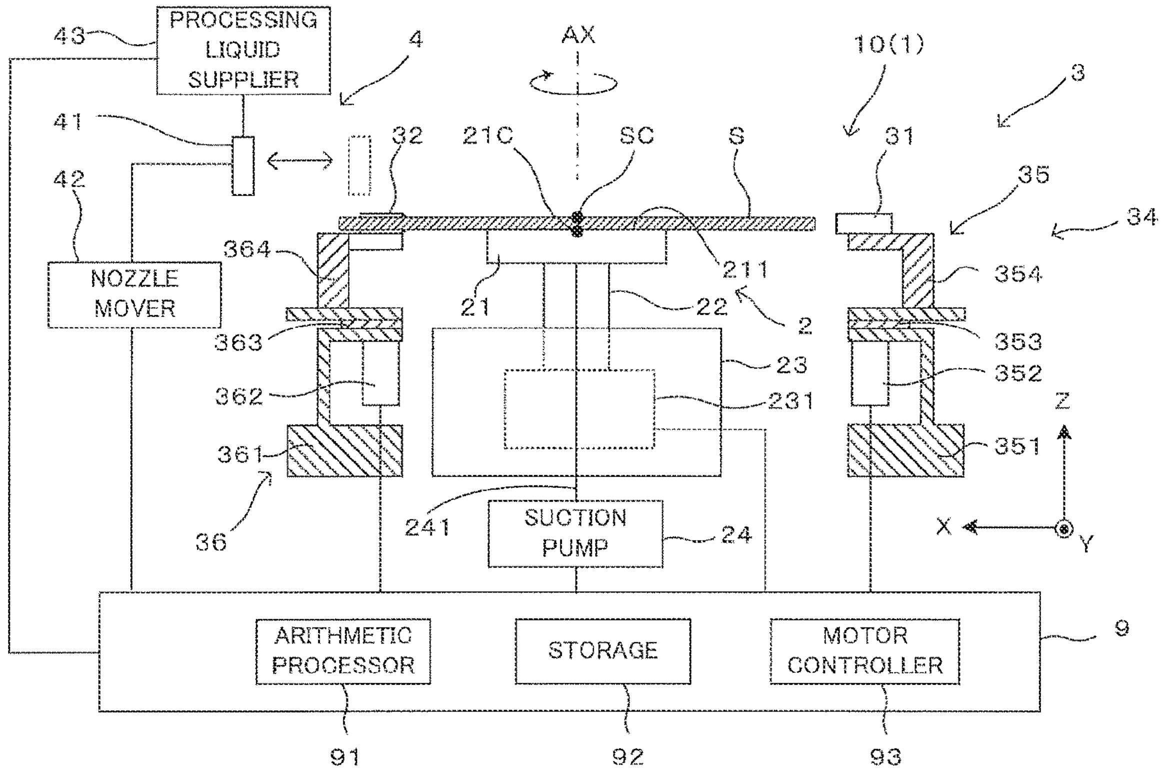
FIG. 2 briefly shows a configuration in one embodiment of the substrate processing apparatus.
Figure 3:
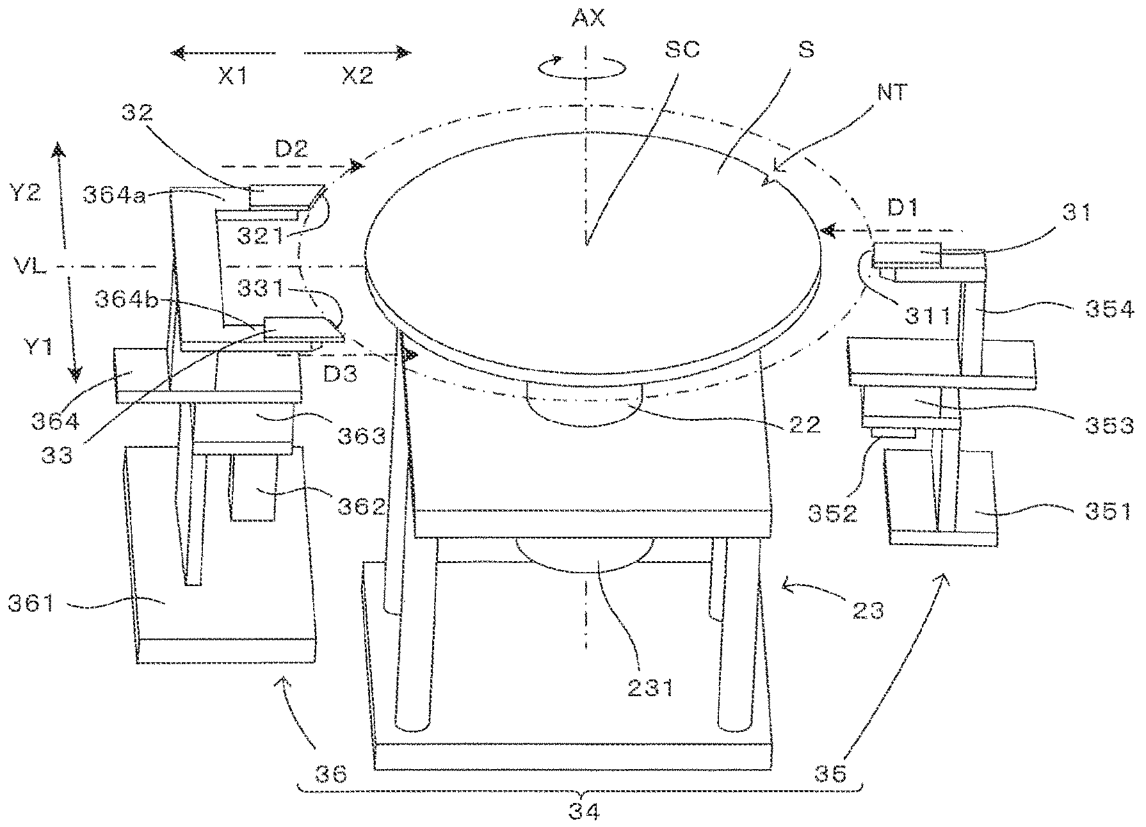
FIG. 3 is a perspective view showing the configurations of a substrate holder and a centering mechanism of the substrate processing apparatus.
Figure 4:
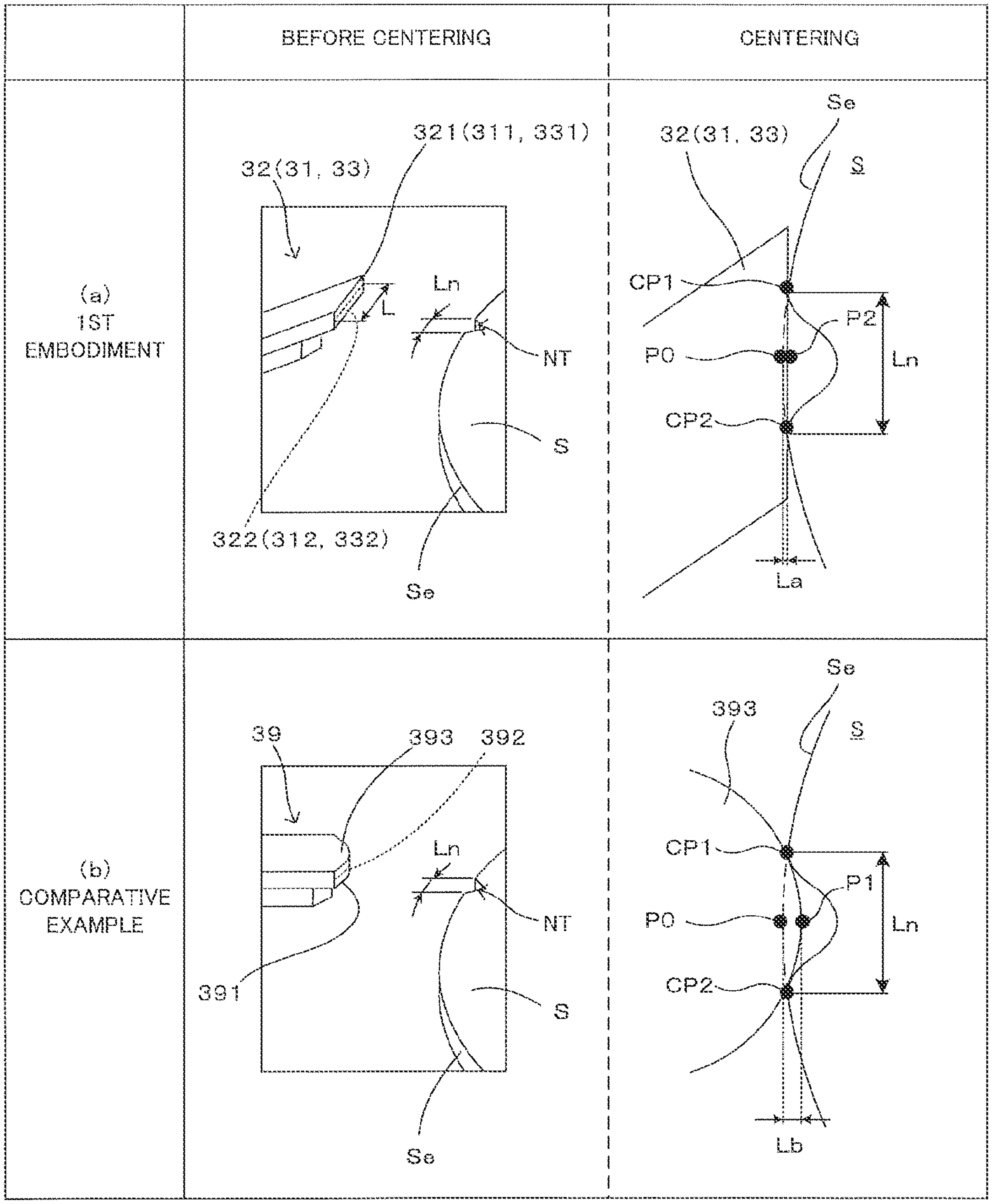
FIG. 4 is a diagram schematically showing the configuration of an abutting member that can be employed in the centering mechanism and the relationship with the notch of the substrate.
Figure 5:
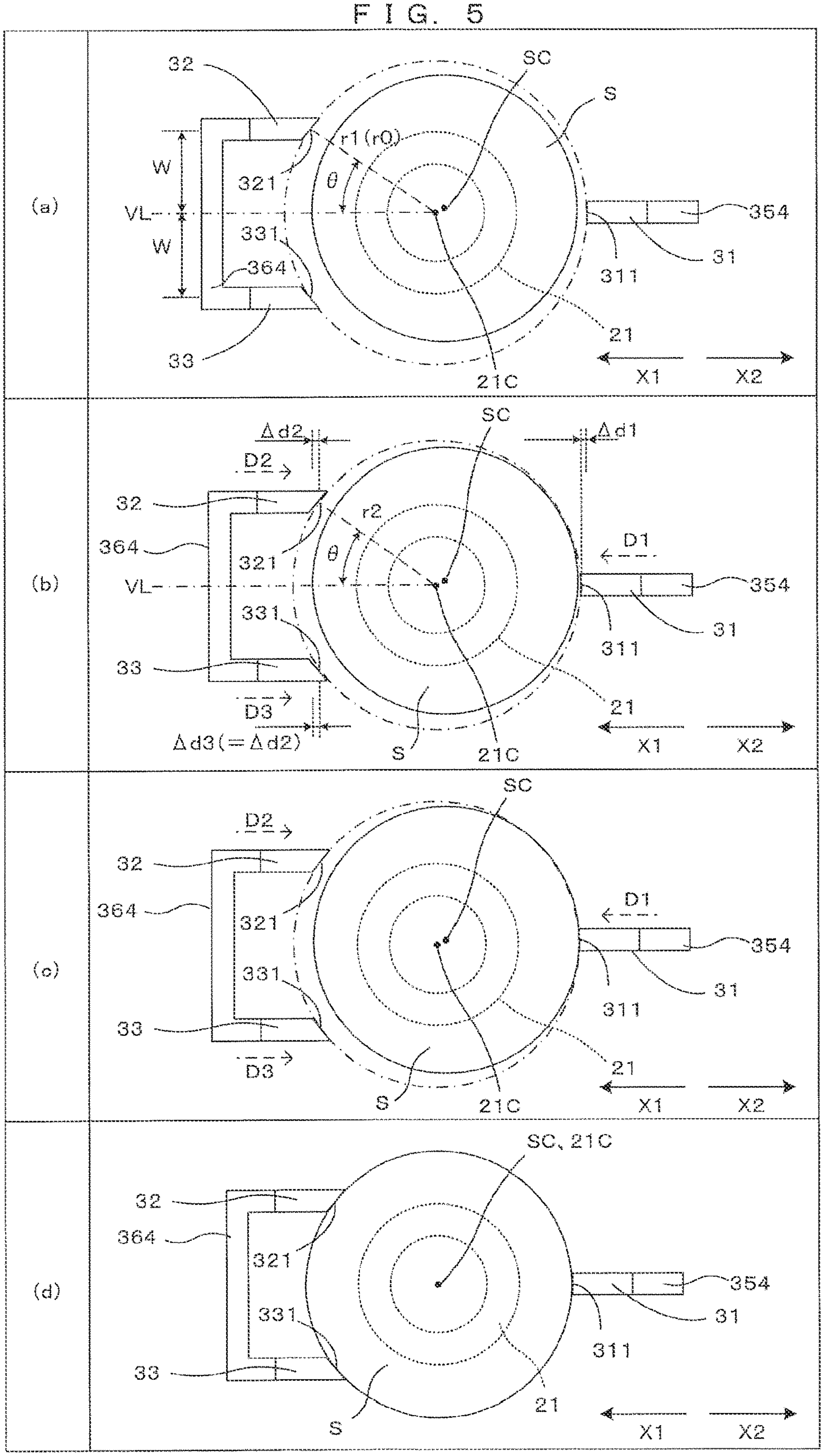
FIG. 5 is a diagram schematically showing the operation of the centering mechanism.
Figure 6:
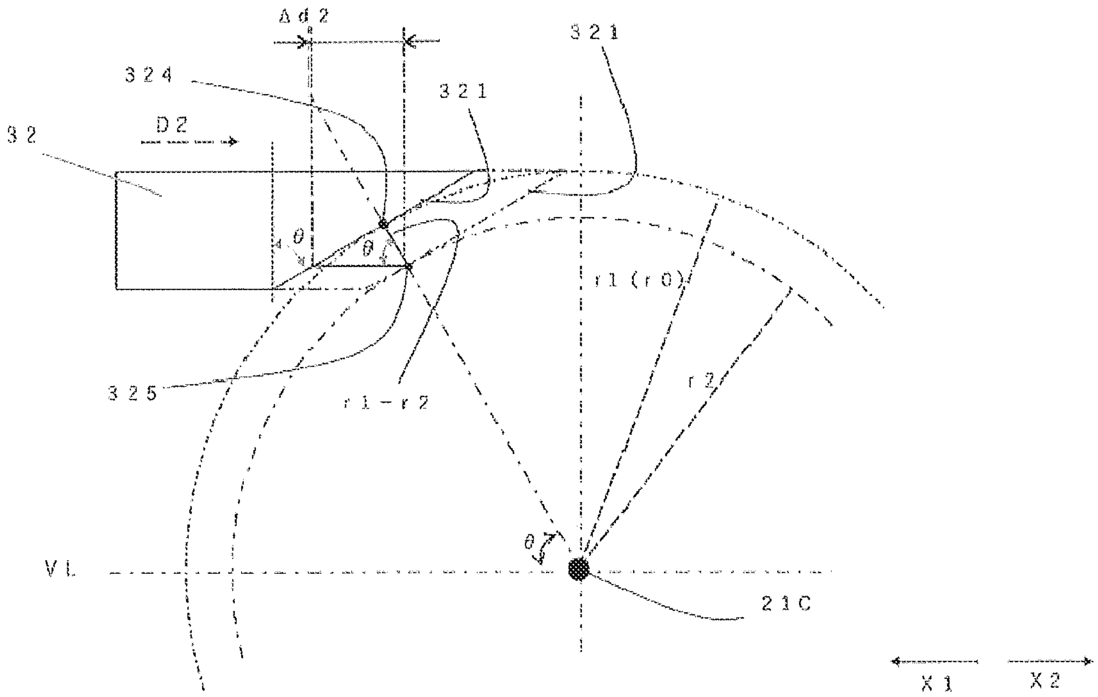
FIG. 6 is a diagram schematically showing the positional relationship between the contact member and the center of the spin base before and after the minute movement.

FIG. 2 briefly shows a configuration in one embodiment of the substrate processing apparatus. FIG. 3 is a perspective view showing the configurations of a substrate holder and a centering mechanism of the substrate processing apparatus. FIG. 4 is a diagram schematically showing the configuration of a contact member that can be employed in the centering mechanism and the relationship with the notch of the substrate. FIG. 5 is a diagram schematically showing the operation of the centering mechanism. FIG. 6 is a diagram schematically showing the positional relationship between the contact member and the center of the spin base before and after the minute movement. The substrate processing apparatus 10 is an apparatus that performs a bevel etching process as an example of a "process" of the present invention, and supplies a processing liquid to a peripheral edge part of an upper surface of the substrate S in a processing chamber. For this purpose, the substrate processing apparatus 10 includes a substrate holder 2, a centering mechanism 3 forming a principal structure of a centering device according to the present invention, and a processing liquid supply mechanism 4. Operations of these structures are controlled by a control unit 9 responsible for control over the apparatus entirely.

The substrate holder 2 includes a spin base 21 that is a member of a smaller circular plate shape than the substrate S. The spin base 21 is supported on a rotary support shaft 22 extending downward from a central part of a lower surface of the spin base 21 in such a manner as to locate an upper surface 211 of the spin base 21 horizontally. The rotary support shaft 22 is rotatably supported by a rotary driver 23. The rotary driver 23 includes a built-in rotary motor 231. The rotary motor 231 rotates in response to a control command from the control unit 9. In response to receipt of resultant rotary driving force, the spin base 21 rotates about a vertical axis AX (alternate long and short dashed lines) extending in a vertical direction while passing through a center 21C of the spin base 21. In FIG. 2, a top-bottom direction corresponds to the vertical direction. A plane perpendicular to the plane of paper of FIG. 2 is a horizontal plane. To clearly show a relationship in terms of direction, a coordinate system defining a Z axis as the vertical direction and an XY plane as the horizontal plane is given in FIG. 2 and its subsequent drawings, if appropriate.

The upper surface 211 of the spin base 21 has a dimension by which the substrate S is supportable to allow the substrate S to be placed on the upper surface 211 of the spin base 21. Although not shown in the drawings, the upper surface 211 is provided with a plurality of suction holes or suction grooves, for example. Such suction holes or grooves are connected to a suction pump 24 through a suction pipe 241. In response to a control command from the control unit 9, the suction pump 24 operates to apply suction power from the suction pump 24 to the spin base 21. As a result, air is exhausted from between the upper surface 211 of the spin base 21 and a lower surface of the substrate S, thereby holding the substrate S under suction on the spin base 21. Together with the rotation of the spin base 21, the substrate S held under suction in this way rotates about the vertical axis AX. Hence, the occurrence of misalignment between a center SC of the substrate S and the center 21C of the spin base 21, namely, decentering of the substrate S reduces the quality of the bevel etching process.

In response to this, the centering mechanism 3 is provided in the present embodiment. The centering mechanism 3 performs a centering operation while suction using the suction pump 24 is stopped (namely, while the substrate S is horizontally movable on the upper surface 211 of the spin base 21). As a result of implementation of the centering operation, the above-described decentering is eliminated to make alignment between the center SC of the substrate S and the center 21C of the spin base 21. The configuration and operation of the centering mechanism 3 will be described later in detail.

The processing liquid supply mechanism 4 is provided to perform the bevel etching process on the substrate S after implementation of the centering operation on the substrate S. The processing liquid supply mechanism 4 includes a processing liquid nozzle 41, a nozzle mover 42 that moves the processing liquid nozzle 41, and a processing liquid supplier 43 that supplies a processing liquid to the processing liquid nozzle 41. The nozzle mover 42 moves the processing liquid nozzle 41 between a retreat position to which the processing liquid nozzle 41 retreats laterally from a position above the substrate S as indicated by solid lines in FIG. 2 and a processing position above a peripheral edge part of the substrate S as indicated by dotted lines in FIG. 2.

The processing liquid nozzle 41 is connected to the processing liquid supplier 43. When a suitable processing liquid is supplied from the processing liquid supplier 43 to the processing liquid nozzle 41 located at the processing position, the processing liquid is ejected from the processing liquid nozzle 41 onto a peripheral edge part of the rotating substrate S. By doing so, the bevel etching process with the processing liquid is performed on the entire peripheral edge part of the substrate S.

Although not shown in FIG. 2, a splash guard is provided in such a manner as to surround the substrate holder 2 from the side. The splash guard collects droplets of a processing liquid blown off from the substrate S during implementation of the bevel etching process to effectively prevent the collected droplets from flying around the apparatus.

The configuration of the centering mechanism 3 will be described next by referring to FIGS. 2 to 6. The centering mechanism 3 has the function of determining the position of the substrate S by moving the substrate S horizontally on the upper surface 211 of the spin base 21 in such a manner as to align the center SC of the substrate S placed on the upper surface 211 of the spin base 21 with the center 21C of the spin base 21. As shown in FIG. 3, as viewed in the X direction, the centering mechanism 3 includes a contact member 31 arranged closer to an X2 direction (right-hand direction in FIG. 3) and a contact member 32 and a contact member 33 arranged closer to an X1 direction (left-hand direction in FIG. 3) with respect to the center 21C of the spin base 21. The centering mechanism 3 further includes a moving mechanism 34 for moving the contact members 31 to 33 in a horizontal direction.

The moving mechanism 34 includes a single mover 35 for moving the contact member 31, and a multi-mover 36 for moving the contact members 32 and 33 collectively. The single mover 35 is arranged closer to the X2 direction and the multi-mover 36 is arranged closer to the X1 direction with respect to the center 21C of the spin base 21.

The single mover 35 includes a fixed base 351, a rotary motor 352, a power transmitter 353, and a slider 354. The rotary motor 352 is mounted on the fixed base 351, and the power transmitter 353 and the slider 354 are stacked in this order over the fixed base 351. The rotary motor 352 is a driving source for moving the contact member 31 in the X direction. When the rotary motor 352 operates in response to a control command from the control unit 9, a rotary shaft (not shown in the drawings) rotates. This rotary shaft extends from the top of the fixed base 351 to the power transmitter 353 and rotary driving force generated by the rotary motor 352 is transmitted to the power transmitter 353. Using a rack-and-pinion structure, for example, the power transmitter 353 converts rotary motion responsive to the rotary driving force to liner motion in the X direction, and transmits the linear motion to the slider 354. This makes the slider 354 move back and forth in the X direction by a distance responsive to the amount of the rotation. As a result, in response to the movement of the slider 354, the contact member 31 mounted on the top of the slider 354 is moved in the X direction.

The multi-mover 36 has a configuration basically the same as that of the single mover 35 except that a slider 364 has a partially different structure. Specifically, the multi-mover 36 applies rotary driving force generated by a rotary motor 362 mounted on a fixed base 361 to the slider 364 using a power transmitter 363, thereby moving the slider 364 in the X direction. The slider 364 has a top including two arms 364*a* and 364*b* extending in the X2 direction and separated from each other in a Y direction. The top of the slider 364 has a substantially C-shape in a plan view from vertically above. The contact members 32 and 33 are mounted on end portions closer to the X2 direction of the arms 364*a* and 364*b* respectively. Thus, when the rotary motor 362 operates in response to a control command from the control unit 9, the slider 364 moves back and forth in the X direction by a distance responsive to the amount of the rotation of the rotary motor 362, like in the single mover 35. As a result, in response to the movement of the slider 364, the contact members 32 and 33 mounted on the slider 364 are moved in the X direction.

The contact members 31 to 33 have contact surfaces 311 to 331 capable of contacting the end face Se of the substrate S, respectively. With these contact surfaces 311 to 331 directed toward the end face Se of the substrate S, the contact members 31 to 33 are arranged so as to surround the substrate holder 2 in the XY plane (horizontal plane). The contact surfaces 311 to 331 have a planar shape, and their surface normals face the vertical axis AX. For example, as shown in section (a) of FIG. 4, on the contact surface 321, a linear region 322 that intersects a virtual horizontal plane including the substrate S placed on the upper surface of the substrate holder 2 corresponds to the "contactable region" of the present invention. Its length L is longer than the length Ln of the arc along which the circumference of the substrate S is cut off by the notch NT. Therefore, when the contact member 32 is moved toward the end face Se of the substrate S during centering, it contacts the end face Se of the substrate S at one or two points in the linear region 322. That is, as shown in FIG. 4, when the substrate S is placed on the upper surface of the spin base 21 with the notch NT facing the contact surface 321, the two contact points CP1 and CP2 on the linear region 322 contact on the end face Se of the substrate S. On the other hand, in other areas, one contact point on the linear region 322 contacts the end face Se of the substrate S. The same applies to the contact surfaces 311 and 331 as well. The reason why the contact members 31 to 33 are configured as described above will be described later in detail with reference to FIG. 4.

When the contact member 31 is moved in the X1 direction by the single mover 35, a contact surface 311 of the contact member 31 goes toward the center 21C of the spin base 21 to contact on the end face Se of the substrate S. As described above, in the present embodiment, a D1 direction in which the contact member 31 moves for abutting on the substrate S is the X1 direction, and this direction corresponds to a "first horizontal direction" of the present invention. After making the abutting contact, the contact member 31 moves further in the D1 direction, thereby moving the substrate S horizontally on the upper surface 211 of the spin base 21 in the X1 direction while pressing the substrate S in the X1 direction. In the present embodiment, to facilitate understanding of the substance of the invention, a virtual line VL extended in the X1 direction from the center 21C of the spin base 21 is additionally illustrated in FIGS. 3, 5 and 6. This line corresponds to a "virtual line" of the present invention. The configuration of the centering mechanism 3 will be described continuously using the virtual line VL in appropriate cases.

A configuration in which the contact members 32 and 33 are moved by the multi-mover 36 partially differs from that of the contact member 31. The reason for this is that the contact members 32 and 33 are arranged line-symmetrically to each other with respect to the virtual line VL in the horizontal plane and are moved in the X direction while being kept in this arrangement state. More specifically, as shown in a section (a) of FIG. 5, the contact member 32 is arranged at a position deviating from the virtual line VL by a predetermined distance W (shorter than a radius rs of the substrate S) to be closer to a Y2 direction. Meanwhile, the contact member 33 is arranged at a position deviating by the same distance W as the contact member 32 from the virtual line VL to be closer to the opposite side of the contact member 32 with respect to the virtual line VL, specifically, to be closer to a Y1 direction. Thus, when the contact members 32 and 33 are moved in the X2 direction by the multi-mover 36, a contact surface 321 of the contact member 32 contacts on the end face at a position closer to the Y2 direction than the virtual line VL. Furthermore, a contact surface 331 of the contact member 33 contacts on the end face at a position closer to the Y1 direction than the virtual line VL. As described above, in the present embodiment, a D2 direction in which the contact member 32 moves for abutting on the substrate S is the X2 direction, and this direction corresponds to a "second horizontal direction" of the present invention. A D3 direction in which the contact member 33 moves for abutting on the substrate S is also the X2 direction, and this direction corresponds to a "third horizontal direction" of the present invention. Thus, in order to move the contact surfaces 311, 321, and 331 while distances from the center 21C of the spin base 21 to the contact surfaces 311, 321, and 331 are kept equally, a movement amount per unit time is required to differ between the contact member 31 and the contact members 32, 33. This will be described in detail by referring to FIGS. 5 and 6, and the centering operation using the above-described configuration of movement will also be described.

To place the substrate S on the upper surface 211 of the spin base 21, the contact surfaces 311, 321 and 331 are desirably positioned at reference positions at least in consideration of a maximum value of an outer diameter tolerance of the substrate S. For example, in the substrate S having a diameter of 300 mm, the outer diameter tolerance is 0.2 mm. Accordingly, the contact surfaces 311, 321 and 331 need to be separated from the center 21C of the spin base 21 by a distance of 150.1 mm or more. This distance is referred to as a "reference distance r0" in this embodiment and, as shown in field (a) of FIG. 5, a circle (one-dot chain line) having a radius centered on the center 21C of the spin base 21 and equal to the reference distance r0 is a reference circle.

Next, a case is studied where the contact surfaces 311, 321 and 331 are moved toward the substrate S after the contact members 31 to 33 are so positioned that the contact surfaces 311, 321 and 331 are located on the reference circle. In this case, the position of the contact member 31 for positioning the contact surface 311 on the reference circle corresponds to a "first reference position" of the invention, the position of the contact member 32 for positioning the contact surface 321 on the reference circle corresponds to a "second reference position" of the invention, and the position of the contact member 33 for positioning the contact surface 331 on the reference circle corresponds to a "third reference position" of the invention.

Here, a case is studied next, where the contact members 31 to 33 are located at the first reference position, the second reference position, and the third reference position respectively, the contact member 31 makes a tiny movement by a first movement amount Δd1 in the D1 direction (X1 direction) toward the substrate S. If each of the contact members 32 and 33 makes a tiny movement by the same distance in the D2 direction (X2 direction) in response to the movement of the contact member 31, the contact surfaces 311, 321, and 331 are separated by nonuniform distances from the center 21C of the spin base 21. Hence, repeating the tiny movements of the contact members 31 to 33 while keeping a uniform movement amount per unit time results in the failure to align the center SC of the substrate S with the center 21C of the spin base 21.

In contrast, as shown in field (b) of FIG. 5 and FIG. 6, the contact surfaces 311, 321 and 331 can be moved while keeping the distances from the center 21C of the spin base 21 to the respective contact surfaces 311, 321 and 331 equal by finely moving the contact member 32 in the D2 direction by a second movement amount Δd2 and finely moving the contact member 33 in the D3 direction by a third movement amount Δd3 to correspond to a fine movement of the contact member 31 in the D1 direction by a first movement amount Δd1.

FIG. 6 is a diagram schematically showing positional relationships between the contact member 32 and the center 21C of the spin base 21 before and after the fine movement.

FIG. 6 shows a positional relationship between a circle centered on the center 21C of the spin base 21 and having a radius r1 and the contact member 32 and a positional relationship between a circle centered on the center 21C of the spin base 21 and having a radius r2 and the contact member 32. In FIG. 6, the contact member 32 before the fine movement of the contact member 32 in the D2 direction by the second movement amount Δd2 is shown by a solid line and the contact member 32 after the fine movement is shown by a two-dot chain line. FIG. 6 shows a contact point 324 between the circle centered on the center 21C of the spin base 21 and having the radius r1 and the contact member 32 and a contact point 325 between the circle centered on the center 21C of the spin base 21 and having the radius r2 and the contact member 32.

As shown in FIG. 6, the contact points 324 and 325 are at different positions on the contact member 32. On the other hand, a straight line connecting the center 21C of the spin base 21 and the contact point 324 and a straight line connecting the center 21C of the spin base 21 and the contact point 325 overlap. Further, an angle between the straight line connecting the center 21C of the spin base 21 and the contact point 324 and a virtual line VL and an angle between the straight line connecting the center 21C of the spin base 21 and the contact point 325 and the virtual line VL are equal.

Thus, a fine moving distance Δd2 (corresponding to a "second movement amount" of the invention) of the contact member 32 and a fine moving distance Δd3 (corresponding to a "third movement amount" of the invention) of the contact member 33 can be set as follows:

$\Delta d2 = \Delta d3 = (r1 - r2)/\cos\theta = \Delta d1/\cos\theta$, $r1 = r0$, and $r2 = r1 - \Delta d1$, where:

- r1: distance from the center 21C to the contact surface 321 before the fine movement,
- θ: angle between the straight lines connecting the center 21C of the spin base 21 and the contact points 324, 325 and the virtual line,
- r2: distance from the center 21C to the contact surface 321 after the fine movement, and
- W: separation distance of the contact member 32 from the virtual line VL.

In this case, even after the fine movement, the distances from the center 21C of the spin base 21 to the contact surfaces 311, 321 and 331 are equal. By repeating such fine movements, the contact members 31 to 33 approach the substrate S while keeping the distances from the center 21C of the spin base 21 to the contact surfaces 311, 321 and 331 equal. Then, for example, if there is a deviation as shown in FIG. 5, the contact member 31 first contacts the substrate S and moves the substrate S in the D1 direction while the above fine movements are repeated (see field (c) of FIG. 5). Subsequent to that, the contact member 32 contacts the substrate S pushed by the contact member 31 and horizontally moves the substrate S. Then, if the distances from the center 21C of the spin base 21 to the contact surfaces 311, 321 and 331 become the radius of the substrate S as shown in field (d) of FIG. 5, the last contact member 33 also contacts the substrate S. In this way, the substrate S is sandwiched by the contact members 31 to 33 to stop a movement thereof, and the center SC of the substrate S is aligned with the center 21C of the spin base 21. In this way, the centering process of the substrate S can be performed.

In the present embodiment including the centering mechanism 3, the control unit 9 controls each part of the substrate processing apparatus 10 to perform the centering operation described above and the subsequent bevel etching process. The control unit 9 includes an arithmetic processor 91 composed of a computer with a central processing unit (CPU), a random access memory (RAM), etc., a storage 92 such as a hard disk drive, and a motor controller 93.

Figure 7:
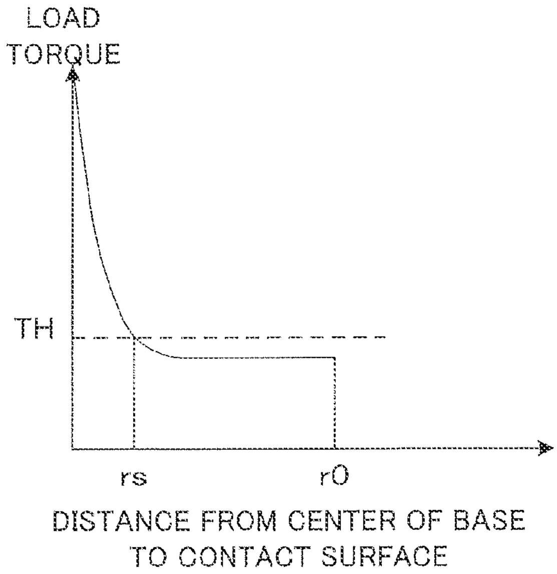
FIG. 7 is a graph showing variations in load torque with respect to variations in a distance from a center of a base to a contact surface in the first embodiment.

The arithmetic processor 91 reads a centering program and a bevel etching program as appropriate stored in advance in the storage 92, develops the program in the RAM (not shown in the drawings), and performs the centering operation and the bevel etching process shown in FIG. 5. In particular, in performing the centering operation, the arithmetic processor 91 calculates the first movement amount Δd1 to the third movement amount Δd3, and controls the rotary motors 352 and 362 of the moving mechanism 34 through the motor controller 93 on the basis of the calculated movement amounts Δd1 to Δd3. Furthermore, the arithmetic processor 91 calculates a load torque at the single mover 35 on the basis of a motor current value applied to the rotary motor 352 and calculates a load torque at the multi-mover 36 on the basis of a motor current value applied to the rotary motor 362. In response to change in a distance from the center 21C of the spin base 21 to each of the contact surfaces 311, 321, and 331 (a distance from the base center to the contact surface) occurring while the tiny movements are repeated, the load torque varies in a manner shown in FIG. 7, for example. As shown in FIG. 7, at a time when this distance conforms to the radius rs of the substrate S, specifically, when the substrate S is nipped with the contact members 31 to 33, the load torques increase steeply at the single mover 35 and the multi-mover 36 nearly simultaneously. At a time when the load torque exceeds a threshold, the arithmetic processor 91 determines that the centering operation is completed and stops the movements of the contact members 31 to 33. In the present embodiment, variation in the load torque at each of the motors 352 and 362 is monitored. Alternatively, only one of the motors may be monitored to determine timing of stopping movements of the contact members 31 to 33. Additionally, the load torque may certainly be calculated on the basis of an element other than the motor current value.

As described above, in the present embodiment, the contact members 31 to 33 make the tiny movements repeatedly to get closer to the substrate S gradually while distances from the center 21C of the spin base 21 to the contact surfaces 311, 321, and 331 are kept equally. Then, the substrate S is nipped with the three contact members 31 to 33 to align the center SC of the substrate S with the center 21C of the spin base 21. As described above, the centering operation is performed only through the tiny movements of the contact members 31 to 33 made repeatedly. This achieves implementation of the centering operation with excellent throughput (effect A).

The completion of the centering operation is determined on the basis of variation in the load torque and the movements of the contact members 31 to 33 are stopped immediately. This makes it possible to finish the centering operation at appropriate time without damaging the substrate S (effect B). This also applies to embodiments described later.

Further, since the contact members 31 to 33 have linear regions 312, 322 and 332 formed to intersect an XY plane as shown in field (a) of FIG. 4, still another effect is obtained. A contact member having a tip part finished into a semi-disk shape (see field (b) of FIG. 4) or a tip part finished into a sharp shape or a contact member having a roller shape is generally known as a technique for pushing and moving the end face Se of the substrate S in a horizontal direction.

Therefore, the effects A and B described above are obtained by using contact members having these shapes.

However, for example, in a comparative example shown in field (b) of FIG. 4, a tip part 393 of a contact member 39 has a semi-disk shape. In this contact member 39, a contact surface 391 facing the end face Se of the substrate S is finished into a convex shape toward the substrate S. Accordingly, on the contact surface 391, a curved region 392 intersecting a virtual horizontal plane including the substrate S placed on the upper surface of the substrate holder 2 has a curved shape having a center of curvature located on the side of the contact member 39. Thus, if the substrate S is placed on the upper surface of the spin base 21 with the notch NT facing the contact surface 391, a part of the tip part 393 is in contact with the substrate S at two contact points CP1, CP2 on the curved region 392 while entering the notch NT. As a result, at the time of centering, the contact surface 391 moves to a position P1 closer to the substrate S by an eccentric deviation amount than a position P0 where the contact surface 391 is positioned in contact with the end face Se of the substrate S. As a result, a pushing position of the contact member 39 deviates from a position for a precise centering process. For example, if the centering process was performed with the contact members 31 to 33 replaced by the contact members 39 in the centering mechanism 3 shown in FIG. 3, the following experimental result was obtained. Here, if the centering process was performed with the substrate (semiconductor wafer having a radius of 150 mm) placed on the spin base 21 rotated by a suitable rotation angle (e.g. 32°, 180° or 328°) about the vertical axis AX and the notch NT facing the contact surface 391, a deviation amount of the pushing position, i.e. the eccentric deviation amount reached up to 240 μm.

In contrast, in this embodiment, the contact surfaces 311 to 331 of the contact members 31 to 33 have a flat surface shape. Thus, as shown in field (a) of FIG. 4, a region (corresponding to an example of a "contactable region" of the invention) intersecting the virtual plane including the substrate S placed on the upper surface of the substrate holder 2 has a linear shape in each of the contact surfaces 311 to 331. Moreover, any of these linear regions 312, 322 and 332 is longer than an arc length Ln. Accordingly, if the substrate S is placed on the upper surface of the spin base 21 with the notch NT facing the contact surface 321 as shown in FIG. 4, two contact points CP1, CP2 on the linear region 322 are locked by shoulder parts of the notch NT, which can effectively prevent a part of the contact member 32 from entering the notch NT. Further, the contact surface 321 moves to a position P2 closer to the substrate S by an eccentric deviation amount La than a position P0 where the contact surface 321 is positioned in contact with the end face Se of the substrate S, but the eccentric deviation amount La is drastically smaller than an eccentric deviation amount Lb in the comparative example.

Figure 8:
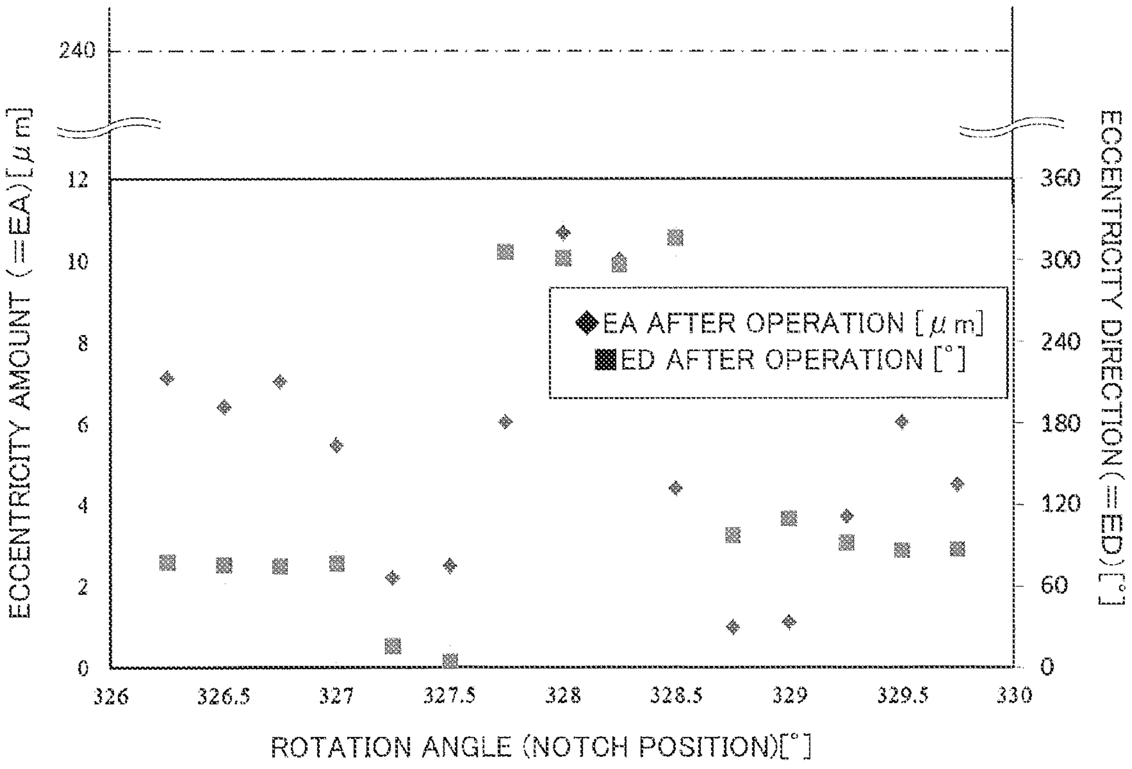
FIG. 8 is a graph showing the eccentricity amount and the eccentricity direction corresponding to a positional relationship of the notch with the contact surface.

Here, when an eccentricity amount and an eccentricity direction were measured while a rotation amount of the substrate (semiconductor wafer having a radius of 150 mm) placed on the spin base 21 about the vertical axis AX was switched by 0.25° in a range of 326.25° to 329.75° in the centering mechanism 3 shown in FIG. 3, experimental results shown in FIG. 8 were obtained.

FIG. 8 is a graph showing the eccentricity amount and the eccentricity direction corresponding to a positional relationship of the notch with the contact surface. In FIG. 8, the rotation angle represents the positional relationship between the notch NT and the contact surface 321. The entire notch NT is facing the contact surface 321 as shown in FIG. 4 at 328°, and the notch NT is deviated from the contact surface 321 in a circumferential direction of the substrate S at 327.25° or less or 328.75° or more. Further, in FIG. 8, a rhombus mark represents the eccentricity amount after a centering operation, and a square mark represents the eccentricity direction after the centering operation. As is clear from FIG. 8, even if the centering process is performed in such a posture that the notch NT faces the contact surface 321, the eccentricity amount can be suppressed up to about 11 μm. That is, by using the contact member 32 having the contact surface 321 configured as described above, the eccentric deviation amount can be drastically suppressed regardless of the position of the notch NT. This point applies also to the contact surface 311 of the contact member 31 and the contact surface 331 of the contact member 33. As a result, centering accuracy can be drastically improved as compared to the comparative example by performing the centering process by sandwiching the substrate S placed on the upper surface of the spin base 21 by these contact surfaces 311, 321 and 331.

A combination of the centering mechanism 3 and the control unit 9 corresponds to the first embodiment of the centering device according to the invention, but the configurations of the contact surfaces 311, 321 and 331 in the centering mechanism 3 are not limited to this. For example, the contact surfaces 311, 321 and 331 may be finished such that contactable regions intersecting the XY plane are curved as shown in FIG. 9 (second embodiment).

Figure 9:
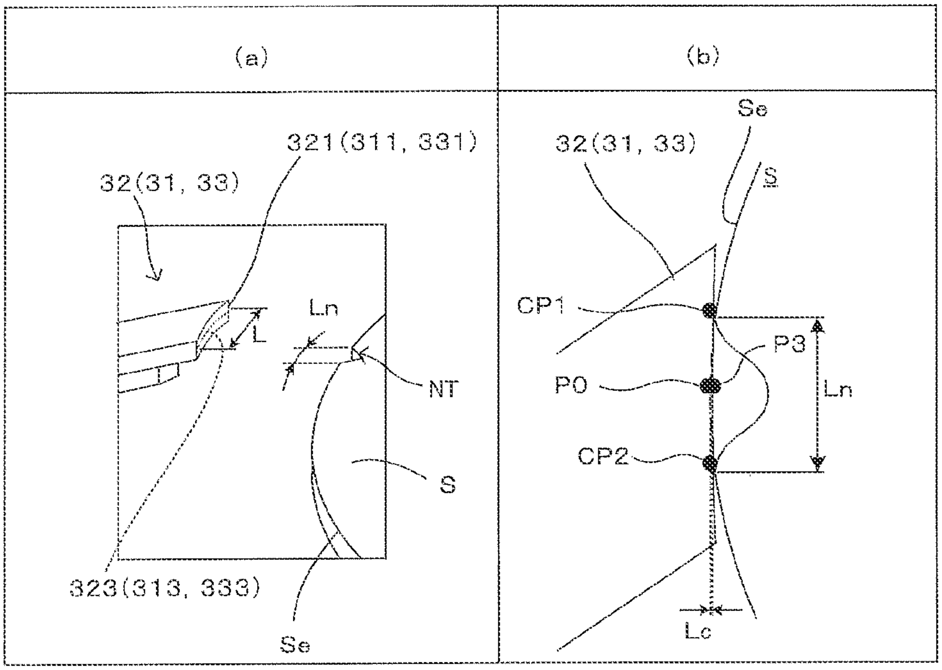
FIG. 9 is a diagram schematically showing the configuration of a contact member adopted in the second embodiment of the centering device according to the invention and a relationship with a notch of a substrate.

FIG. 9 is a diagram schematically showing the configuration of a contact member adopted in the second embodiment of the centering device according to the invention and a relationship with a notch of a substrate. This second embodiment largely differs from the first embodiment in that contact surfaces 311, 321 and 331 have a curved shape along an end face Se of a substrate S, and the other configuration is the same as in the first embodiment. Therefore, the following description is centered on points of difference and the same components are denoted by the same reference signs and are not described.

As shown in field (a) of FIG. 9, on a contact surface 321, a curved region 323 intersecting a virtual horizontal plane including the substrate S placed on the upper surface of a substrate holder 2 corresponds to an example of the "contactable region" of the invention. That is, the contact surface 321 is finished such that a center of curvature of the curved region 323 is located on the side of the substrate S and a radius of curvature of the curved region 323 is larger than a radius of the substrate S. Accordingly, at the time of centering, the contact member 32 contacts the end face Se of the substrate S at one or two points in the curved region 323 if the contact member 32 is moved toward the end face Se of the substrate S. That is, as shown in FIG. 9, if the substrate S is placed on the upper surface of a spin base 21 with a notch NT facing the contact surface 321, two contact points P1, P2 on the curved region 323 are locked by shoulder parts of the notch NT, which can effectively prevent a part of the contact member 32 from entering the notch NT. Further, the contact surface 321 moves to a position P3 closer to the substrate S by an eccentric deviation amount Lc than a position P0 where the contact surface 321 is positioned in contact with the end face Se of the substrate S, but the eccentric deviation amount Lc is smaller than the eccentric deviation amount La in the first embodiment. This point applies also to the contact surface 311 of the contact member 31 and the contact surface 331 of the contact member 33.

Figure 10:
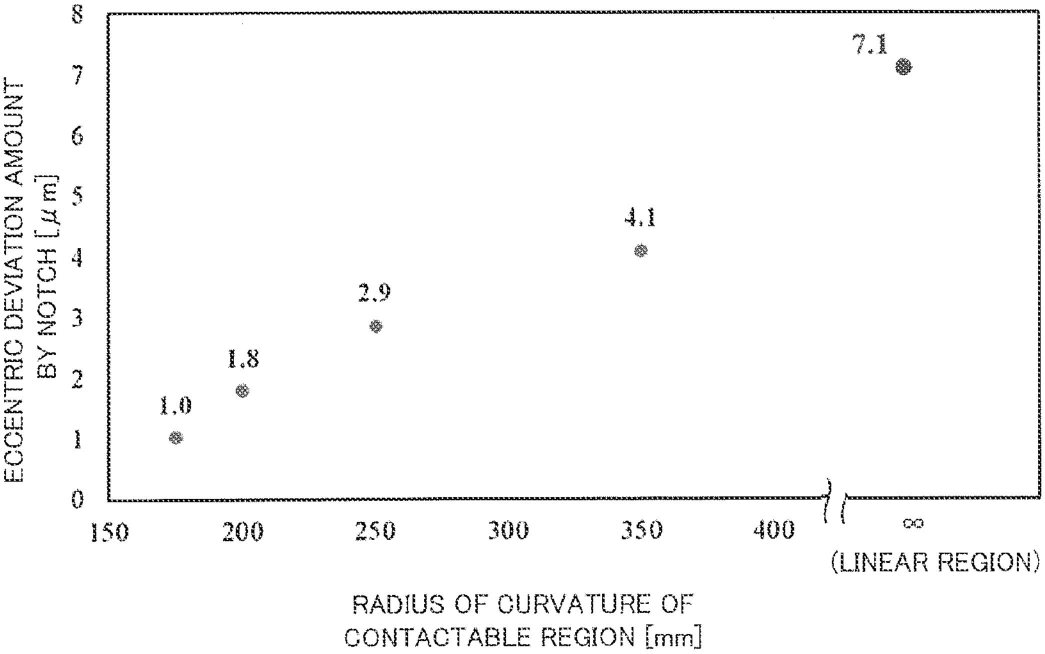
FIG. 10 is a graph showing a change of the eccentric deviation amount in relation to a degree of curvature of the contact surface.

Here, if an eccentric deviation amount by the notch NT (angle of 1.119°) provided in the substrate S (semiconductor wafer having a radius of 150 mm) was obtained while the radius of curvature was changed in multiple stages, an experimental result shown in FIG. 10 was obtained. FIG. 10 is a graph showing a change of the eccentric deviation amount in relation to a degree of curvature (radius of curvature) of the contact surface. As is clear from FIG. 10, the eccentric deviation amount L decreases as the radius of curvature approaches the radius of the substrate S. If the radius of curvature and the radius of substrate coincide, there is theoretically no influence of the notch NT. However, in consideration of tolerances of the substrate S, it is actually unusable to cause the radius of curvature to coincide with the radius of the substrate S. Therefore, in the second embodiment, the contact surfaces 311, 321 and 331 are finished such that radii of curvature of the curved regions 313, 323 and 333 are larger than the radius of the substrate S.

As described above, in the substrate processing apparatus 10, a combination of the centering mechanism 3 and the control unit 9 corresponds to the first embodiment of the centering device according to the present invention. Specifically, the contact members 31 to 33 correspond to an example of a "first contact member," an example of a "second contact member," and an example of a "third contact member" of the present invention respectively. The control unit 9 corresponds to an example of a "controller" of the present invention. The spin base 21 and the center 21C correspond to an example of a "substrate support" and an example of the "center of the substrate support" of the present invention respectively. The suction pump 24 corresponds to an example of a "suction unit" of the present invention.

In the first embodiment described above, the two contact members 32 and 33 are moved in the D2 direction (X2 direction) and in the D3 direction (X2 direction) respectively by the multi-mover 36. However, the multi-mover 36 may be replaced with a single mover for the contact member 32 and a single mover for the contact member 33 each having the same configuration as the single mover 35. In this case, the single movers provided for the contact members 31 to 33 correspond to an example of a "first single mover," an example of a "second single mover," and an example of a "third single mover" of the present invention respectively.

Like in this case, if the single mover for the contact member 32 and the single mover for the contact member 33 are provided, both the D2 direction and the D3 direction are not required to conform to the X2 direction but at least one of the D2 direction and the D3 direction may be changed from the X2 direction (second embodiment).

Figure 11:
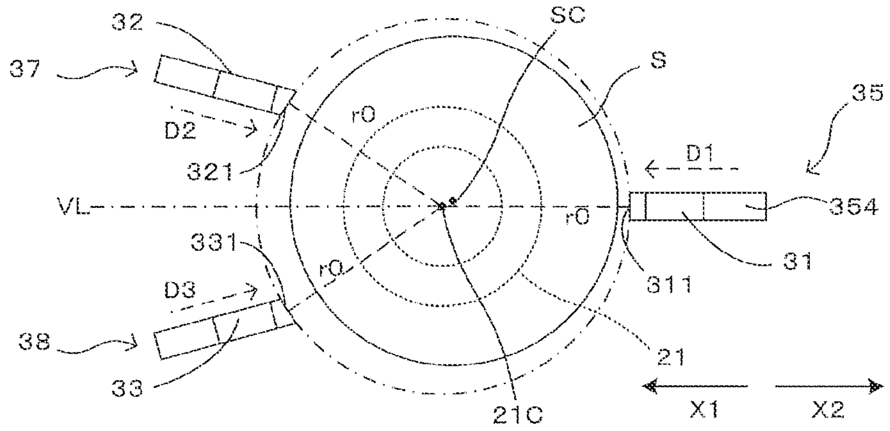
FIG. 11 schematically shows a configuration in a third embodiment of the centering device according to the present invention.

FIG. 11 schematically shows a configuration in a third embodiment of the centering device according to the present invention. The third embodiment largely differs from the first embodiment in that the multi-mover 36 is replaced with a single mover 37 for the contact member 32 and a single mover 38 for the contact member 33 each having the same configuration as the single mover 35, and that both the D2 direction and the D3 direction differ from the X2 direction. In the third embodiment, like the cases of the sections (a) and (b) of FIG. 5 and like the considerations given to the second movement amount and the third movement amount on the basis of these sections, the second movement amount and the third movement amount are set individually. The other configuration and the other operation are basically the same as those of the first embodiment.

Also in the third embodiment having the above-described configuration, the contact members 31 to 33 successively abut on the substrate S so the substrate S is nipped with the contact members 31 to 33 while distances from the center 21C of the spin base 21 to the contact surfaces 311, 321, and 331 are kept equally. By doing so, the center SC of the substrate S is aligned with the center 21C of the spin base 21. In this way, the centering operation is performed only through tiny movements of the contact members 31 to 33 made repeatedly to achieve implementation of the centering operation with excellent throughput.

Note that the invention is not limited to the above embodiments and various changes other than the aforementioned ones can be made without departing from the gist of the invention. For example, in the above-described embodiments, nipping the substrate S with the contact members 31 to 33, namely, completion of the centering operation is detected on the basis of variation in a load torque. The detection may be made by another method. In an exemplary configuration, the single mover 35 or 38 or the multi-mover 36 may be provided with a sensor such as a load cell or a strain gauge, and stress or strain may be detected by the sensor when the substrate S is nipped with the contact members 31 to 33 to output a detection signal. In this case, the control unit 9 determines nipping the substrate S with the contact members 31 to 33 on the basis of the detection signal from the sensor.

In the above-described embodiments, the present invention is applied to the centering device provided to the substrate processing apparatus 10 that performs the bevel etching process. Meanwhile, the centering device according to the present invention is applicable to every type of centering device provided to a substrate processing techniques that performs a process while rotating a substrate of a circular plate shape and to and every type of centering method. Also, the centering device according to the present invention may be used alone.

Further, although the substrate is centered using the three contact members in the above embodiments, the invention can be applied to a centering device using four or more contact members.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

This invention can be applied to a centering technique for horizontally moving and positioning a substrate such that a center of the substrate is aligned with a center of a substrate support with the disk-like substrate provided with a cut such as a notch placed in a horizontal posture on the upper surface of the substrate support, and substrate processing apparatuses in general for processing a substrate utilizing the centering technique.

What is claimed is:

1. A centering device for horizontally moving and positioning a disk-like substrate such that a center of the substrate is aligned with a center of a substrate support while the substrate having a cut in a peripheral edge part of the substrate is placed in a horizontal posture on an upper surface of the substrate support, the centering device comprising:

three or more contact members each having a contact surface, the three or more contact members being arranged to surround the substrate support in a horizontal plane in such a posture that, when the substrate is placed on the substrate support, the contact surfaces are configured to face and contact an end face of the substrate;

a moving mechanism configured to move the contact members toward the substrate in mutually different directions; and a controller configured to control the moving mechanism to sandwich the substrate by moving the contact members toward the substrate, wherein each contact surface includes a contactable region that intersects the horizontal plane, has a linear shape, and is longer than an arc formed by cutting out a circumference of the substrate by the cut, wherein each of the contact members is arranged such that the contact surface is orthogonal to the horizontal plane and a surface normal of the contact surface faces the center of the substrate support, wherein the contact members includes:

a first contact member separated from the center of the substrate support by a reference distance longer than a radius of the substrate and movable in a first horizontal direction from a first reference position toward the center of the substrate support in the horizontal plane;

a second contact member deviated from a virtual line extending in the first horizontal direction from the center of the substrate support on a side opposite to the first contact member with respect to the center of the substrate support, separated from the center of the substrate support by the reference distance and movable in a second horizontal direction different from a direction from a second reference position toward the center of the substrate support and approaching the substrate in the horizontal plane and a third contact member separated by the reference distance from the center of the substrate support on the side opposite to the first contact member with respect to the center of the substrate support and on a side opposite to the second contact member with respect to the virtual line and movable in a third horizontal direction different from a direction from a third reference position toward the center of the substrate support and approaching the substrate in the horizontal plane, wherein the moving mechanism is configured to move the first contact member, the second contact member and the third contact member respectively in the first horizontal direction, the second horizontal direction and the third horizontal direction, wherein the controller is configured to repeat fine movements to move the first contact member, the second contact member and the third contact member respectively by a first movement amount, a second movement amount and a third movement amount so that distances to the first contact member, the second contact member and the third contact member from the center of the substrate support are kept equal, and stop the fine movements upon confirming that the substrate is sandwiched by the first contact member, the second contact member and the third contact member, wherein the second horizontal direction and the third horizontal direction are directions parallel to the virtual line, wherein the third reference position is symmetrical with the second reference position with respect to the virtual line, wherein the second movement amount and the third movement amount are the same value, and wherein the first movement amount is a different value from the second movement amount and the third movement amount.

2. A substrate processing apparatus, comprising:

a substrate support having an upper surface configured to support a disk-like substrate provided with a cut in a peripheral edge part in a horizontal posture;

the centering device according to claim 1;

a suction unit configured to suck and hold the substrate on the substrate support by exhausting air between the substrate positioned by the centering device and the substrate support;

a rotation driver configured to rotate the substrate support sucking and holding the substrate about a center of the substrate support; and a processing liquid supply mechanism configured to supply a processing liquid to the peripheral edge part of the substrate rotated about the center of the substrate support integrally with the substrate support.

* * * * *